United States Patent [19]
Topping et al.

[11] Patent Number: 5,921,460
[45] Date of Patent: Jul. 13, 1999

[54] METHOD OF SOLDERING MATERIALS SUPPORTED ON LOW-MELTING SUBSTRATES

[75] Inventors: Mark Stephen Topping, Lincoln Park; Cuong Van Pham, Northville; Brian John Hayden, Royal Oak, all of Mich.

[73] Assignee: Ford Motor Company, Dearborn, Mich.

[21] Appl. No.: 08/870,049

[22] Filed: Jun. 5, 1997

[51] Int. Cl.⁶ .......................... H05K 3/34; H01L 21/607
[52] U.S. Cl. .................... 228/111.5; 228/180.21
[58] Field of Search .................. 228/110.1, 111.5, 228/262, 179.1, 180.21, 251; 29/827, 840

[56] References Cited

U.S. PATENT DOCUMENTS

| | | |
|---|---|---|
| 3,255,511 | 6/1966 | Weissenstern et al. ............. 228/110.1 |
| 3,387,365 | 6/1968 | Stelmark . |
| 3,391,451 | 7/1968 | Moore . |
| 3,459,610 | 8/1969 | Dijkers et al. . |
| 3,470,611 | 10/1969 | McIver et al. ...................... 228/111.5 |
| 3,607,580 | 9/1971 | Obeda . |
| 3,683,105 | 8/1972 | Shamash et al. . |
| 3,694,897 | 10/1972 | Akeyoshi et al. . |
| 3,733,687 | 5/1973 | Tanaka et al. . |
| 3,851,383 | 12/1974 | Peltz . |
| 3,949,118 | 4/1976 | Nagano et al. . |
| 4,189,825 | 2/1980 | Robillard et al. . |
| 4,546,409 | 10/1985 | Yoshino et al. ...................... 228/111.5 |
| 4,776,509 | 10/1988 | Pitts et al. . |
| 4,842,662 | 6/1989 | Jacobi . |
| 4,893,742 | 1/1990 | Bullock ............................... 228/1.1 |
| 5,240,166 | 8/1993 | Fontana, Jr. et al. ............... 228/111.5 |
| 5,288,006 | 2/1994 | Otsuka et al. . |
| 5,299,726 | 4/1994 | Sauer ................................. 228/111.5 |

Primary Examiner—Samuel M. Heinrich
Attorney, Agent, or Firm—Joseph W. Malleck

[57] ABSTRACT

A method of soldering materials by controlling ultrasonic energy to effect melting of only the solder in an assembly to be joined that is carried on a low temperature melting substrate. The method facilitates making electrical connections for completing an electronic circuit unit that is supported on a low temperature melting substrate and comprises (a) positioning together first and second conductive terminals for said circuit with a solder deposit therebetween to form an assembly, at least one of the terminals of such assembly being supported directly on such low temperature melting substrate; (b) gripping the assembly between an ultrasonic motion generating horn and an anvil, while exciting the horn to apply ultrasonic vibration to the first terminal to provide sufficient shearing energy that frictionally rubs at least one surface of the solder deposit in a rubbing direction generally parallel to said one surface to rapidly heat and melt the solder deposit; and (c) essentially immediately upon the completion melting of the solder deposit, ceasing the application of ultrasonic shearing energy to allow the solder to solidify and form a soldered diffusion joint between the terminals.

8 Claims, 2 Drawing Sheets

METHOD OF SOLDERING MATERIALS SUPPORTED ON LOW-MELTING SUBSTRATES

TECHNICAL FIELD

This invention relates to the technology of joining metals and more particularly to joining conductive metallic terminals that are embedded in or supported on low-melting substrates, such as plastics, by use of ultrasonic energy.

DISCUSSION OF THE PRIOR ART

Ultrasonic energy has been used to bond metals, particularly terminals of integrated circuit components, which terminals are supported on refractory or insulating substrates that are not affected by high temperatures, (such as in the range of 200–300° C.). Bonding takes place without relying on or requiring the interposition of any foreign material, such as a solder material. Such ultrasonic bonding requires that enough energy be imparted to heat the metallic terminals up close to the melting temperature of the metallic terminals, such temperatures (along with the application of pressure) being necessary to promote molecular diffusion to achieve a bond. Damage to or one or more of the terminals or substrates can occur due to excess stress concentration. Such joints are not repairable by the later applications of heat.

Ultrasonic energy has also been used to deposit conventional solder onto ceramic or metals oxides which deposit is then heated to melt the solder and effect a joint. Such ceramics or metal oxides can withstand the temperature needed to melt the chemistry of such conventional solders (i.e. about 250° C.) in a furnace, but other heat sensitive parts such as low melting substrates that support the terminals, such as plastics, would be destroyed by temperatures needed to melt such solders in a furnace.

SUMMARY OF THE INVENTION

It is an object of this invention to provide a method of soldering materials by controlling ultrasonic energy to effect melting of only the solder in an assembly to be joined that is carried on a low temperature melting substrate.

In more particularity, the invention is a method of making electrical connections for completing an electronic circuit unit that is supported on a low temperature melting substrate, comprising; (a) positioning together first and second conductive terminals for said circuit with a solder deposit therebetween to form an assembly, at least one of the terminals of such assembly being supported directly on such low temperature melting substrate; (b) gripping the assembly between an ultrasonic motion generating horn and an anvil, while exciting the horn to apply ultrasonic vibration to the first terminal to provide sufficient shearing energy that frictionally rubs at least one surface of the solder deposit in a rubbing direction generally parallel to said one surface to rapidly heat and melt the solder deposit; and (c) essentially immediately upon the complete melting of the solder deposit, ceasing the application of ultrasonic shearing energy to allow the solder to solidify and form a soldered diffusion joint between the terminals.

DETAILED DESCRIPTION AND BEST MODE

Figure 1:
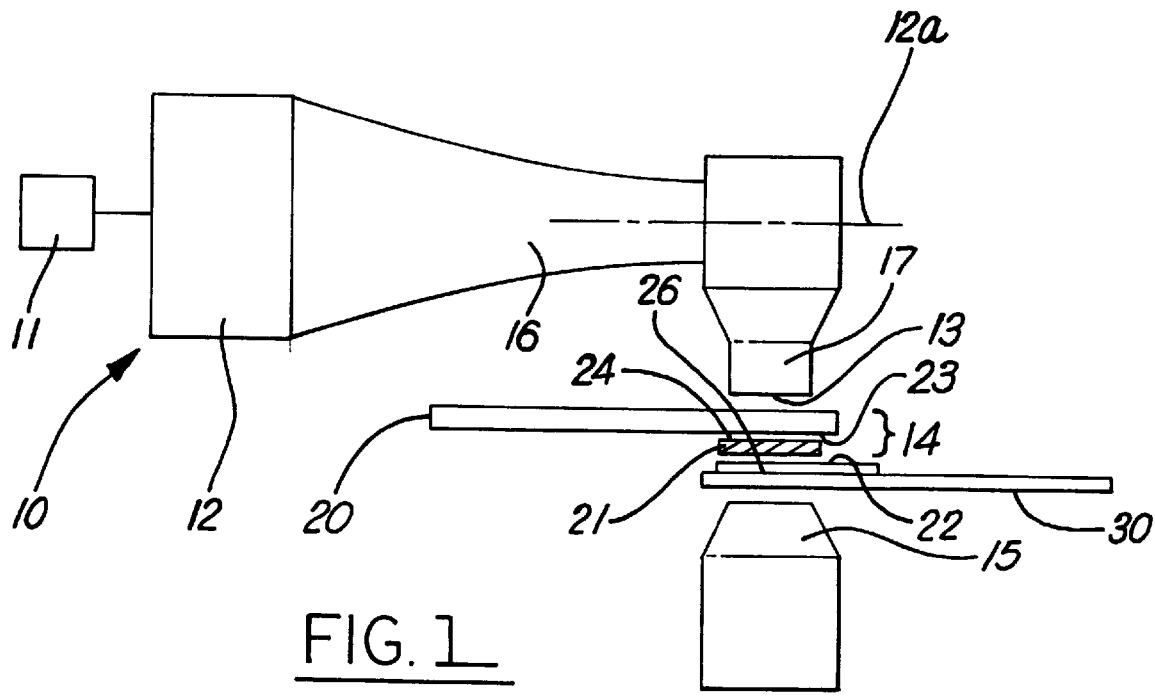
FIG. 1 is a schematic illustration of an apparatus for carrying out soldering, in accordance with this invention, for an assembly that has at least one conductive member to be joined that readily spreads heat, such as a metal bar, and an integrated circuit composed of foil or a printed metallic trace on a supporting circuit board.
Figure 2:
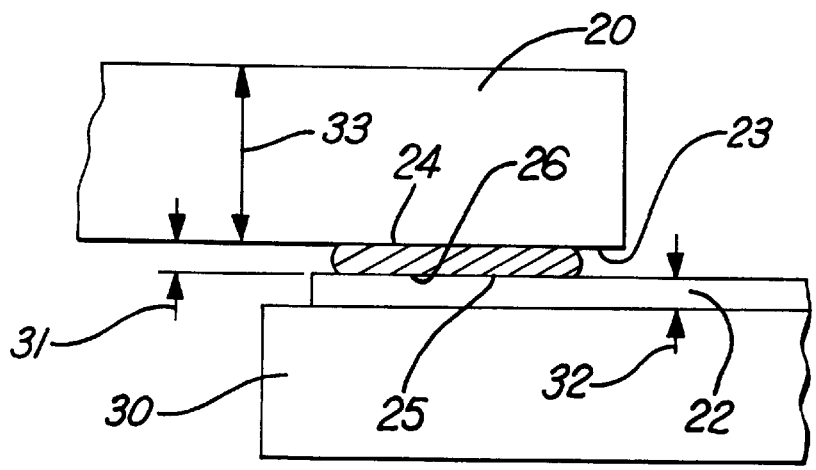
FIG. 2 is a highly enlarged view of a portion of the apparatus and assembly of FIG. 1, shown in the mode of applying ultrasonic energy.

As shown in FIGS. 1 and 2, soldering under this invention is carried out by use of an ultrasonic motion generating apparatus 10 that has a converter 11 (for converting electrical energy to sonic vibration energy) and an amplifying horn 12 that has a working surface 13 pressed against an assembly 14 that is supported against movement away from the horn by an anvil 15. The horn 12 is comprised of solid metal that is mechanically connected to the converter to vibrate in response thereto; the horn has a reduced tool arm 16 extending along the axis 12a of the converter and a cross arm 17 extending transversely from the end of the tool arm 16 and which terminates in the working surface 13. The surface 13 is knurled or roughened to allow it to grip the assembly 14 for imparting shearing or horizontal vibration.

The assembly 14 is comprised of a metallic bar or part 20, a metallic deposit of solder 21 and a metallic circuit 22 in the form of conductive foil or metallic tracing. Such metallic elements 20, 21, 22 present hard surfaces 23, 24, 25, 26 which when the surface of the lowest melting element. The ultrasonic generating apparatus vibrates the surface or face 13 of the horn in an x-y plane which is here shown as being horizontal. The ultrasonic vibrating frequency of the horn can be preselected between 20,000–50,000 Hz, but a desirable frequency is about 35K Hz above 50K Hz an increasing amount of the ultrasonic energy does not result in heat generation whereas below 20K Hz stress waves are created in the work piece material with a decrease in heat generations. The horn surface 13 must be able to transfer vibration in a shearing mode sufficient to create frictional heat between the hard interfaces 23, 24, 25, 26 of the parts to be soldered to form a joint for the assembly. To do so, such surfaces are held in intimate contact by the pressure of the horn with a force sufficient to generate friction(i.e. at a pressure of about 375–900 lbs/in$^2$ psi) against the resistance of the avil. The knurling of surface 13 facilitates gripping of the bar 20 to impart vibration to the interfaces 23, 24, 25, 26. If the pressure were to be above 900 lbs/in$^2$, motion of the tool may be inhibited; if the pressure were to be too light such as well below 375 lbs/in$^2$, there would be insufficient contact pressure to generate friction or a risk that the frictional engagement would not be sustained.

The assembly 14 has at least one critical element or support which can be affected by a high heat; here such element is a circuit board 30 supporting the foil or metallic tracing 22, which is comprised at least in part of plastic. The thickness 31 of the solder is desirably about 0.001 to 0.01 inch while the foil or metallic trace has a thickness 32 of about 0.003 inches which may be deposited by sputtering. The metallic bar or sheet stock, as shown, has a thickness 33 of about 0.032 inches with a width of about 0.05 inches. The circuit board substrate 30, although much thicker than the other elements, melts at a lower temperature of about 70–100° C., while the solder melts at a temperature of about 180–250° C. Generation of heat, by ultrasonic vibration, must be sufficient to melt the solder before affecting the other elements; therefore heat generation must be localized. By controlling the frequency of ultrasonic motion, the contact pressure, and the time period during which the assembly 14 is subjected to ultrasonic vibration, (assuming the solder is of a chemistry that melts in the temperature range of traditional solders) heat generation can be localized and not affect the heat sensitive critical elements.

During ultrasonic soldering according to this invention, and as shown in FIG. 2, primary heat generation takes place between the mating surface 23 of the bar and top surface 24 of the solder, which surfaces are frictionally engaged as shown. Vibration is also imparted to mating surface 25 of the solder bottom and surface 26 of the circuit trace. At the moment the solder melts, ultrasonic vibration is immediately stopped (the time period usually being about 1–2 seconds for the heat generation from vibration to melt the solder). The moment of melting of the solder can be predetermined by empirical trial and error which examines test pieces at different stop times to see the size of the melt as the joint area.

Figure 3:
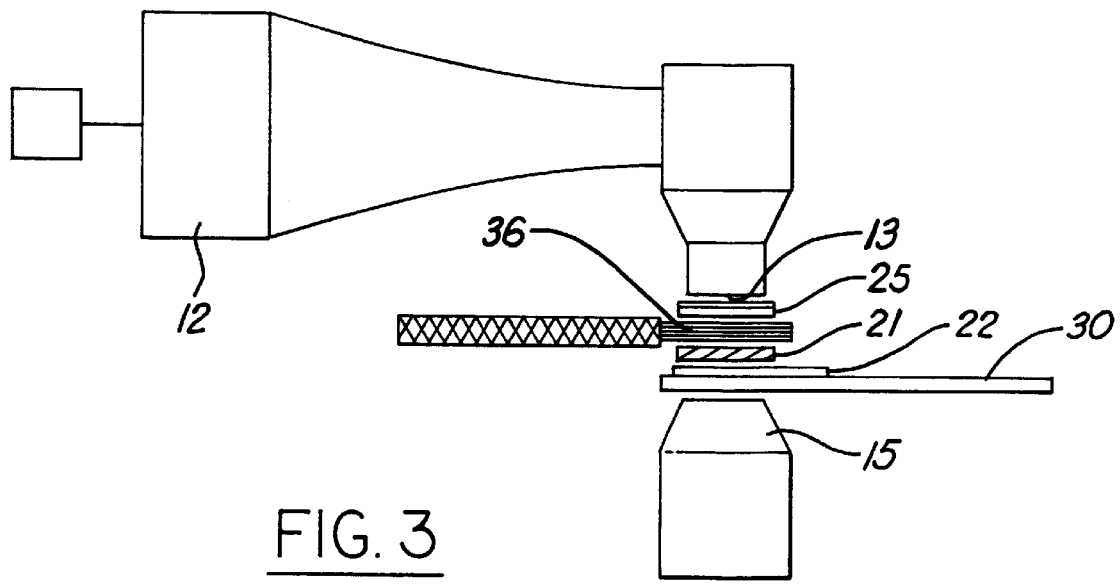
FIG. 3 is a view like FIG. 1, illustrating a modification of an apparatus for soldering elements, at least one of which has a low in the ability to spread heat from the horn to the solder, such as a conductive wire or foil.

FIG. 3 illustrates how copper wire or metal foil may be ultrasonically soldered to a circuit board containing an integrated circuit. In this application, a heat spreader 35 comprised of copper and aluminum is interposed between the surface 13 (of the horn 12)and wire or foil 36, to promote better distribution of the ultrasonic energy over an uneven surface such as possessed by the wire, or to protect the engaged element, such as foil, from being cut by the knurling or the face of the horn.

It would be difficult to solder an assembly where foil two sides are brought together to be soldered (the foil sides confronting each other of two separate integrated circuit boards) because insufficient sonic, vibrations can be transmitted through the board, through the foil to the solder interface. However, this problem can be overcome if one of the boards contain metallic thermal vias extending through the board, coupled with the use of a heat spreader element. The solder may be melted because sufficient heat will be generated utilizing the vibration transmitting thermal vias and the heat spreader 35. Without the thermal vias, insufficient frictional energy is produced to sufficiently melt the solder. If more than usual ultrasonic energy were to be applied to the foils without the thermal vias or without the heat spreader, the board material would burn.

Figure 4:
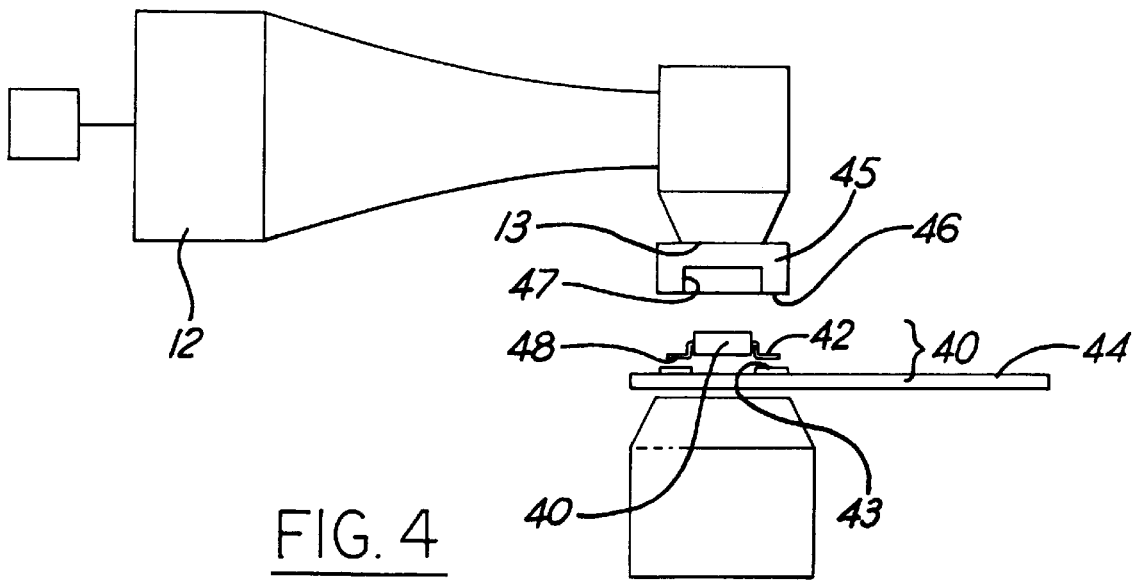
FIG. 4 is a view of still another modification of the apparatus of FIG. 1 that applies ultrasonic energy to a leaded component with depending tinned leads to be soldered to an integrated circuit.

As shown in FIG. 4, application of shearing ultrasonic motion can be applied to an assembly 40 where a leaded component 41 with tinned leads 42 must be soldered to an integrated circuit trace 43 on a heat sensitive circuit board 44. As shown, a special tool 45 on the face 13 of the horn 12 provides an annular surface 46 (defined by recess 47) that engages only the depending leads 42 so that surface 48 of the tin leads may be agitated sufficiently against the trace metal 43 to generate frictional heat that leads to melting of the tin and thus soldering of the leads when ultrasonic vibrations ceases.

While particular embodiments of the invention have been illustrated and described, it will be obvious to those skilled in the art that various changes and modifications may be made without departing from the invention, and it is intended to cover in the appended claims all such modifications and equivalents as fall within the true spirit and scope of this invention.

We claim:

1. A method of making a soldered electrical connection for completing an electronic circuit carried on a substrate having a melting temperature lower than said solder, comprising;

(a) positioning together first and second conductive terminals of said circuit with a solder deposit therebetween to form an assembly, at least one of said terminals of the assembly being supported directly on said substrate;

(b) gripping said assembly between an ultrasonic motion generating horn and an anvil, while exciting said horn to apply ultrasonic vibration to said first terminal to provide sufficient shearing energy that frictionally rubs at least one surface of said solder deposit in a rubbing direction generally parallel to said one surface to rapidly heat and melt said solder deposit and without the addition of an other heat;

(c) essentially immediately upon the complete melting of said solder deposit, ceasing the application of ultrasonic shearing energy to allow the solder to solidify and form a soldered diffusion joint between the terminals.

2. The method as in claim 1, in which said substrate has a melting temperature in the range of 70–100° C. and the solder deposit has a melting temperature in the range of 180–250° C.

3. The method as in claim 2, in which said solder deposit is comprised of Sn-Pb or Sn-Ag.

4. The method as in claim 1, in which said first terminal is comprised of conductive metallic shapes selected from the group of foil, wire, cable or bars.

5. The method as in claim 1, in which said horn is provided with a knurled or roughened gripping surface and such gripping surface is pressed into contact with said assembly with a force of 20–25 psi.

6. The method as in claim 1, in which said ultrasonic frequency of said horn is controlled to be in the range of 15–35 Khz.

7. The method as in claim 1, in which step (b) is carried out for a period of time in the range 1–2 seconds.

8. The method as in claim 1, in which the thickness of said solder deposit is about 0.001–0.01 inches.

* * * * *